US012598884B2

(12) United States Patent
Liu et al.

(10) Patent No.:    US 12,598,884 B2
(45) Date of Patent:         Apr. 7, 2026

(54) DISPLAY PANEL AND DISPLAY DEVICE

(71) Applicant: Kunshan Go-Visionox Opto-Electronics Co., Ltd., Kushan (CN)

(72) Inventors: Mingxing Liu, Kunshan (CN); Junfeng Li, Kunshan (CN); Chao Chi Peng, Kunshan (CN); Xiujian Zhu, Kunshan (CN); Shuaiyan Gan, Kunshan (CN)

(73) Assignee: Kunshan Go-Visionox Opto-Electronics Co., Ltd., Kushan (CN)

( * ) Notice: Subject to any disclaimer, the term of this patent is extended or adjusted under 35 U.S.C. 154(b) by 494 days.

(21) Appl. No.: 17/697,681

(22) Filed: Mar. 17, 2022

(65) Prior Publication Data

US 2022/0208890 A1      Jun. 30, 2022

Related U.S. Application Data

(63) Continuation of application No. PCT/CN2021/075030, filed on Feb. 3, 2021.

(30) Foreign Application Priority Data

Mar. 11, 2020    (CN) .......................... 202010167129.7

(51) Int. Cl.
   *H10K 59/35*          (2023.01)
   *H10K 50/15*          (2023.01)
   (Continued)

(52) U.S. Cl.
   CPC ........... *H10K 59/353* (2023.02); *H10K 50/15* (2023.02); *H10K 50/16* (2023.02); *H10K 59/131* (2023.02); *H10K 59/876* (2023.02)

(58) Field of Classification Search
   None
   See application file for complete search history.

(56) References Cited

U.S. PATENT DOCUMENTS

| | | | |
|---|---|---|---|
| 9,818,803 B2 | 11/2017 | Lee | |
| 2010/0039011 A1* | 2/2010 | Karaki | ................. H10K 59/352 |
| | | | 445/24 |

(Continued)

FOREIGN PATENT DOCUMENTS

| | | |
|---|---|---|
| CN | 107887404 A | 4/2018 |
| CN | 108492723 A | 9/2018 |

(Continued)

OTHER PUBLICATIONS

Translation and Original CN 110491930 (Year: 2019).*

(Continued)

*Primary Examiner* — Jessica S Manno
*Assistant Examiner* — Christopher A. Schodde
(74) *Attorney, Agent, or Firm* — Quarles & Brady LLP

(57)          ABSTRACT

A display panel includes two first sub-pixels and two second sub-pixels which are connected as a first virtual quadrilateral. Each of the two first sub-pixels includes a first subordinate sub-pixel and a second subordinate sub-pixel facing to each other and spaced apart from each other. One of two first vertices of the first virtual quadrilateral being located between the first subordinate sub-pixel and the second subordinate sub-pixel of one of the two first sub-pixels, the other one of the two first vertices being located between the first subordinate sub-pixel and the second subordinate sub-pixel of another one of the two first sub-pixels. Two second sub-pixels are respectively located at two second vertices of the first virtual quadrilateral. The two first vertices and the two second vertices are alternately arranged and spaced (Continued)

apart from each other. The display panel includes a third sub-pixel located within the first virtual quadrilateral.

16 Claims, 9 Drawing Sheets

(51) Int. Cl.

| | |
|---|---|
| *H10K 50/16* | (2023.01) |
| *H10K 59/131* | (2023.01) |
| *H10K 59/80* | (2023.01) |

(56) References Cited

U.S. PATENT DOCUMENTS

| | | | | |
|---|---|---|---|---|
| 2016/0240593 | A1 | 8/2016 | Gu et al. | |
| 2017/0287988 | A1* | 10/2017 | Lee | H10K 50/19 |
| 2017/0317150 | A1* | 11/2017 | Chung | H10K 59/353 |
| 2018/0088260 | A1* | 3/2018 | Jin | G02F 1/1362 |
| 2019/0011830 | A1* | 1/2019 | Ji | H10K 71/00 |
| 2019/0064552 | A1* | 2/2019 | Kim | H10K 59/1315 |
| 2019/0088905 | A1* | 3/2019 | Wang | H10K 59/80524 |
| 2019/0252469 | A1* | 8/2019 | Xiao | H10K 59/122 |
| 2020/0168674 | A1* | 5/2020 | Tan | G02F 1/1333 |
| 2020/0280009 | A1* | 9/2020 | Lin | H10K 50/11 |
| 2020/0402442 | A1* | 12/2020 | Liu | H10K 59/353 |
| 2021/0098539 | A1* | 4/2021 | Zhang | H10K 59/131 |
| 2021/0223452 | A1* | 7/2021 | Zhou | G02B 5/305 |
| 2021/0249483 | A1 | 8/2021 | Li | |
| 2021/0335912 | A1* | 10/2021 | Li | H10K 59/35 |
| 2021/0408203 | A1* | 12/2021 | Shi | H01L 27/124 |
| 2021/0408345 | A1* | 12/2021 | Yao | H01L 33/56 |
| 2023/0006003 | A1* | 1/2023 | Huang | H10K 59/353 |

FOREIGN PATENT DOCUMENTS

| | | | |
|---|---|---|---|
| CN | 105206647 B | 10/2018 | |
| CN | 109860237 A | 6/2019 | |
| CN | 109904200 A | 6/2019 | |
| CN | 110137212 A | 8/2019 | |
| CN | 110491930 A * | 11/2019 | H01L 27/156 |
| CN | 110767733 A | 2/2020 | |
| CN | 111341815 A | 6/2020 | |
| CN | 111341817 A | 6/2020 | |
| WO | 2019153942 A1 | 8/2019 | |

OTHER PUBLICATIONS

International Search Report and Written Opinion (International Application No. PCT/CN2021/075030) with English Translation, dated Apr. 6, 2021, 11 pages.

Chinese First Office Action 100191 (CN Application No. 202010167129.7) and Search Result with English Translation, dated Apr. 7, 2021, 13 pages.

* cited by examiner

A

Intensity (A.U)

DISPLAY PANEL AND DISPLAY DEVICE

CROSS-REFERENCE TO RELATED APPLICATIONS

This application is a continuation under 35 U.S.C. § 120 to international patent application PCT/CN2021/075030, filed on Feb. 3, 2021, entitled "DISPLAY PANEL AND DISPLAY DEVICE", which claims priority to Chinese Patent Application No. 202010167129.7, filed on Mar. 11, 2020, entitled "DISPLAY PANEL AND DISPLAY DEVICE", the contents of both applications are hereby incorporated by reference in their entireties.

TECHNICAL FIELD

The present disclosure relates to the field of display technology.

BACKGROUND

With the continuous development of display technology there is a greater need for a high-resolution display panel. The high-resolution display panel continuously expands its application range due to advantages such as a high display quality.

SUMMARY

The present disclosure provides a display panel and a display device.

Generally, when using a vapor deposition technique, or a film forming technique, an organic material is deposited through a fine mask to form an organic electroluminescent structure at a corresponding sub-pixel position on an array substrate. In order to obtain a high pixel aperture ratio, the distance between adjacent sub-pixels need to be reduced, which increases the difficulty in manufacturing the mask and reduces the reliability of the deposition. In contrast, the pixel aperture ratio will be sacrificed when the distance between sub-pixels is increased to improve deposition reliability.

According to one aspect of the present disclosure, a display panel is provided, which includes:

at least two first sub-pixels and at least two second sub-pixels, wherein the at least two first sub-pixels and the at least two second sub-pixels are connected as a first virtual quadrilateral; wherein each of the at least two first sub-pixels including a first subordinate sub-pixel and a second subordinate sub-pixel, which are facing each other and spaced apart from each other; wherein one of two first vertices of a first virtual quadrilateral, being located between the first subordinate sub-pixel, and the second subordinate sub-pixel of one of the at least two first sub-pixels; and wherein the other one of the two first vertices of the first virtual quadrilateral being located between the first subordinate sub-pixel and the second subordinate sub-pixel of another one of the at least two first sub-pixels; wherein the at least two second sub-pixels respectively located at two second vertices of the first virtual quadrilateral; wherein the two first vertices and the two second vertices are being alternately arranged and spaced apart from each other; and wherein a third sub-pixel is located within the first virtual quadrilateral.

In the aforementioned display panel, the arrangement of the sub-pixels can be more compact, and the aperture ratio of each sub-pixel can be improved. On the other hand, in the aforementioned display panel, the sub-pixels, a color of which the human eye is sensitive to, can be placed in the first virtual quadrilateral to prevent a color shift. In addition, subordinate sub-pixels are provided so that the attenuation rates of the brightness of light emitted by different subordinate sub-pixels can be adjusted to make attenuation speeds of brightness of light with different colors to better match up when the viewing angle increases, thereby reducing the color shift with viewing angle.

According to another aspect of the present disclosure, a display device is provided which includes the aforementioned display panel.

BRIEF DESCRIPTION OF THE DRAWINGS

In order to illustrate the embodiments of the present disclosure more clearly, the drawings used in the embodiments will be described briefly. The following described drawings are merely for the embodiments of the present disclosure, and other drawings can be derived by those of ordinary skill in the art without any creative effort.

DETAILED DESCRIPTION

The present disclosure further described in detail below references the accompanying drawings and embodiments in order to make the objects, technical solutions, and advantages of the present disclosure clearer. It should be understood that the specific embodiments described herein are only for explaining the present disclosure, and not intended to limit the present disclosure.

There are many colorization methods of OLED display panels at present, wherein the OLED vapor deposition technique is a mature OLED colorization technology used for mass production. Specifically, the OLED vapor deposition technique is a vapor deposition technique by which organic light-emitting elements are formed at corresponding sub-pixel positions on an array substrate via a fine metal mask (FMM). The FMM is also referred to as a vapor deposition mask. The technical points of the manufacturing of OLED display panels with a high Pixel Per Inch (PPI), which represents the number of PPI, are the FMM with high precision and good mechanical stability and the arrangement form of the pixels.

Figure 1:
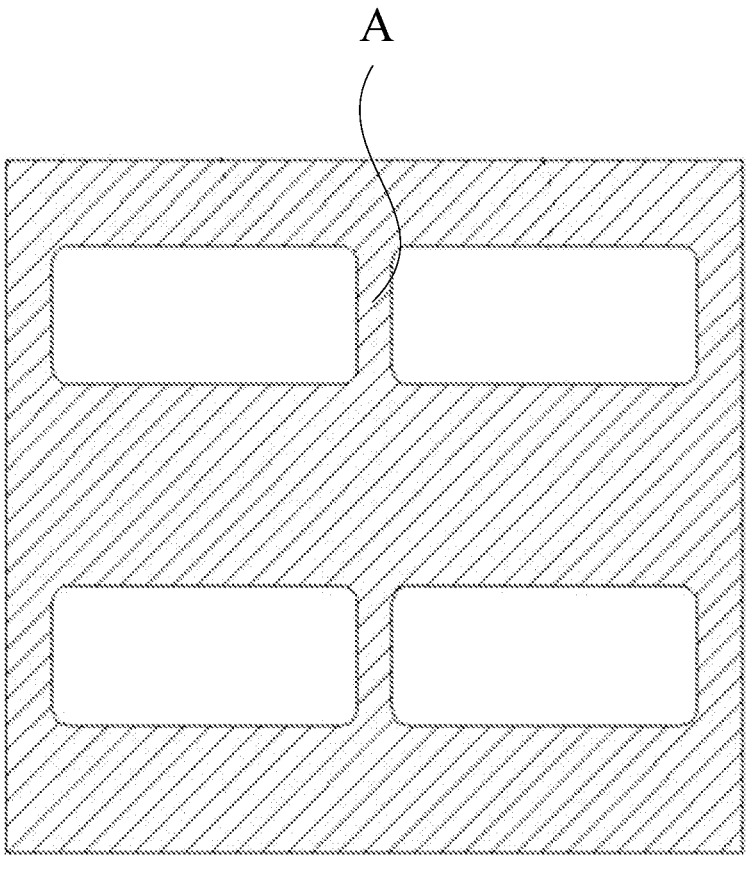
FIG. 1 is a schematic view of a mask according to the prior art.

Specifically, problems in FMM, such as a curve and fracture, should be minimized to avoid defects, such as blurring, and offset of the vapor deposited film, the defects of which will affect the quality of vapor deposition. The arrangement form of the pixels is the main factor for determining whether the FMM is prone to curve and fracture. That is, the arrangement form of the sub-pixels determines the mechanical performance of the FMM to a large extent, and the mechanical performance of the FMM determines the quality of vapor deposition to a larger extent. For example, as shown in FIG. 1, if a distance between two sub-pixels is too small, a connecting portion A between two vapor deposition apertures in the corresponding FMM may be at risk of fracture due to its small width, and the space for alignment between the FMM and the sub-pixel region will also be reduced, which may cause defects of colors being missing or the mixing of colors in the formed sub-pixels. If the width of the connecting portion A is increased, the size of the sub-pixels needs to be reduced, thereby affecting the pixel aperture ratio of the OLED display panel, which is not conducive to achieve a high resolution. Therefore, in the current OLED display device, the distance between the sub-pixels of the pixel arrangement structure is relatively large, which results in a small aperture area of the sub-pixels under the condition of the same resolution. Accordingly, the drive current needs to be increased to satisfy the display brightness requirement.

However, when the OLED display device is operated under a large drive current, the device is prone to aging, thus a phenomenon of color shifts may occur at a large viewing angle, which shortens the service life of the OLED display device. Through research, it is recognized that one reason for this problem is that the decay speeds of the sub-pixels of different color lights are different, which leads to light brightness attenuation with time, and the attenuation rates of light brightness of the sub-pixels of different colors are different. Therefore, when an OLED display element is used for a period of time, the light brightness values of the sub-pixels with different colors are different, which causes a color shift. For example, each pixel unit may include a red sub-pixel, a green sub-pixel, and a blue sub-pixel. Light with high energy is more likely to cause decay of an organic light-emitting material, so that the sub-pixels emitting photons with higher energy are more likely to attenuate. For example, when a blue light emitted by a blue sub-pixel is the visible light with the highest energy and with a wavelength close to the ultraviolet region; the wavelength of the blue light is generally 400 to 500 nanometers. This wavelength is shorter with higher energy, as compared to a red light and green light. Therefore, the light-emitting material of the blue sub-pixel is more likely to decay during a light-emitting process, which causes the light emitted from the pixel unit to become reddish, resulting in a color shift to red in emitted white light. Due to the microcavity effect, this phenomenon becomes more obvious as the viewing angle increases. The microcavity effect refers to the optical thickness of a microcavity and wavelengths of light to satisfy a certain relationship where the light of a specific wavelength is enhanced. In the OLED display element, the microcavity exists, for example, between an anode and a cathode. Lights emitted from a light-emitting layer located between the anode and the cathode are enhanced under the microcavity effect, formed by the anode and the cathode, and lights of different wavelengths are affected by the microcavity effect to different degrees.

In addition, in order to achieve more functions of terminal equipment, a photosensitive device is usually installed under the display panel. For example, a fingerprint identification device can be installed under the display panel. The photosensitive device used to acquire a fingerprint image may include an optical sensor. The optical sensor may include a plurality of pixels, and the plurality of pixels may respectively receive incident lights formed by light signals reflected from different positions of an object, and convert the incident lights into electrical signals, thereby generating an image of the object. Therefore, the amount of the input lights and the contrast of the light signals received by the pixels will affect the quality of the generated object image. Accordingly, the light transmittance of the display panel has to meet certain criteria, which further increases the difficulty in design of the pixel arrangement structure.

Embodiments of the present disclosure provide a display panel and a display device which can better alleviate the aforementioned problems.

Before explaining the present disclosure in detail, some terms appearing in this disclosure are first explained in order to better understand the technical solutions and technical effects of the present disclosure.

Full width at half maximum (FWHM): the full width at half maximum refers to the width of a peak of light spectrum at half of the height of the peak. In other words, when a straight line parallel to a bottom of a peak is drawn through a midpoint of the peak height, a distance between the two points where this straight line intersects with the peak is the FWHM.

Viewing angle: the viewing angle refers to an angle at which a user views an image, and that is, an angle between a line connecting the user's eyes to a certain point on a display surface of the display panel and a normal line of the display surface at that point. If the user views the image from the front of the display panel, the viewing angle is 0°, and as the user's observation point moves from the front to a side, the viewing angle gradually increases. Specifically, the viewing angle will gradually increase from the front to any of a bottom side, a top side, a left side, and a right side.

Figure 2:
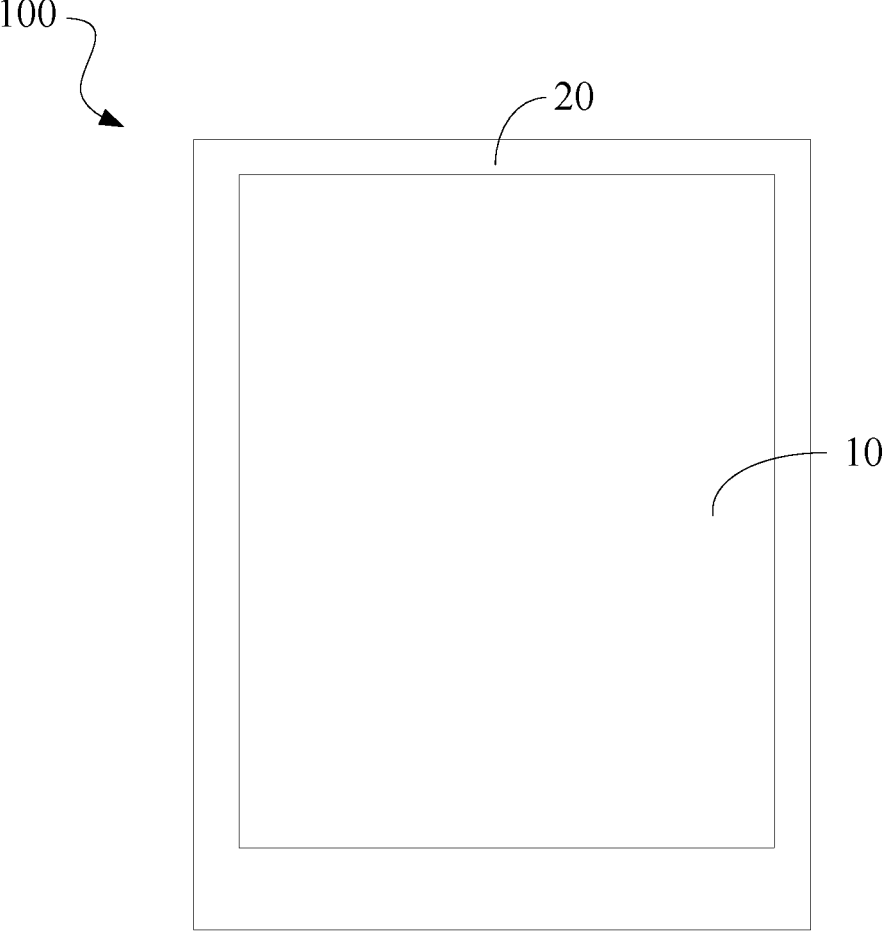
FIG. 2 is a schematic view of a display panel according to an embodiment of the present disclosure.

Referring to FIG. 2, the display panel 100 according to an embodiment of the present disclosure includes a display region 10 and a non-display region 20, and the display region 10 displays an image through a plurality of sub-pixels. In the present embodiment, the display region 10 may have a shape of rectangle, and the non-display region 20 is arranged around the display region 10. However, shape and the arrangement of the display region 10 and the non-display region 20 are not limited to this embodiment. For example, when the display panel 100 is used in a wearable device, the display region 10 may have a round shape like a watch dial. When the display panel 100 is used in a vehicle, the display region 10 and the non-display region 20 may have round, polygonal, or other shapes. The display region 10 is provided with a plurality of sub-pixels configured to emit lights of different colors, and the sub-pixels are defined as the smallest member configured to emit lights (for example, the smallest addressable member of the display panel 100).

An embodiment of the present disclosure provides a pixel arrangement structure, which includes first sub-pixels, second sub-pixels, and third sub-pixels, which respectively emit lights of different colors. The first sub-pixel, the second sub-pixel, and the third sub-pixel may respectively emit red light, blue light, and green light, and cooperatively constitute a pixel capable of emitting white light.

In other embodiments, the first sub-pixel, the second sub-pixel, and the third sub-pixel may emit colors other than red, green, and blue, which are not limited herein.

Lights with different colors have different wavelengths. The greater the wavelength, the larger the energy of the light. Lights with larger energies are more likely to cause the decay of the organic light-emitting material, so that the sub-pixels emitting photons with larger energy are more likely to attenuate. In the spectrum graph shown in FIG. 3, the horizontal axis is the wavelength in unit of nanometer, and the vertical axis is the light intensity. As the wavelength of a blue light is shorter than the wavelength of a red light and green light, the energy of a blue light is larger, and the organic light-emitting material emitting blue light is more likely to decay, so that the light emitted from the pixel unit is prone to be reddish, resulting in a color shift of white light. In addition, since the light emitted by each sub-pixel is repeatedly reflected and re-reflected between the anode and the cathode, via the microcavity effect, an amplification and a constructive interference are performed on the light, as such the brightness of the light increases, and the color shift is further amplified.

In an embodiment, a light-emitting area (i.e., the pixel aperture area) of the sub-pixel emitting blue light (for example, the second sub-pixel 14) is greater than a light-emitting area of the sub-pixel emitting red light (for example, the first sub-pixel 12) and also greater than a light-emitting area of the sub-pixel emitting green light (for example, the third sub-pixel 16). Accordingly, display defects caused by different decay rates of the organic light-emitting materials emitting lights of different colors may be reduced to a certain extent.

Since human eyes are more sensitive to green light, in some embodiments, the light-emitting area of the green sub-pixel is smaller than the light-emitting area of the red sub-pixel. In other embodiments, the light-emitting area of the green sub-pixel may be equal to the light-emitting area of the red sub-pixel, which is not limited herein.

Figure 4:
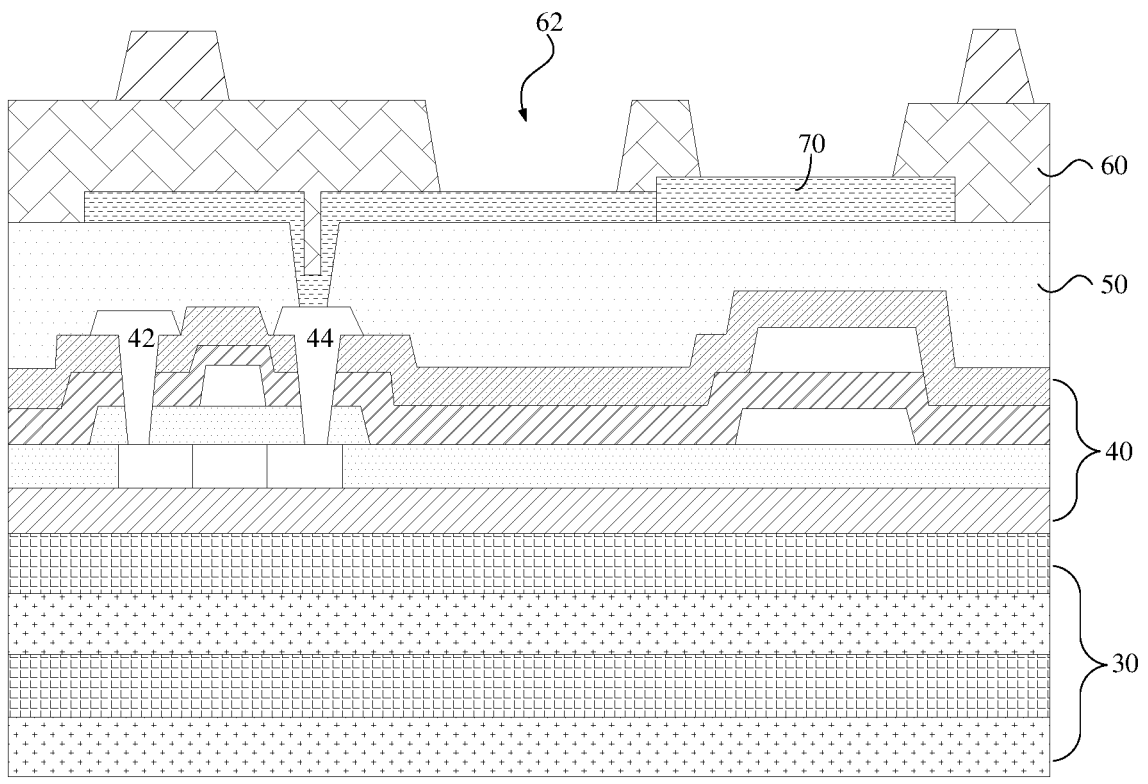
FIG. 4 is a cross-sectional view of a display panel according to an embodiment of the present disclosure.
Figure 5:
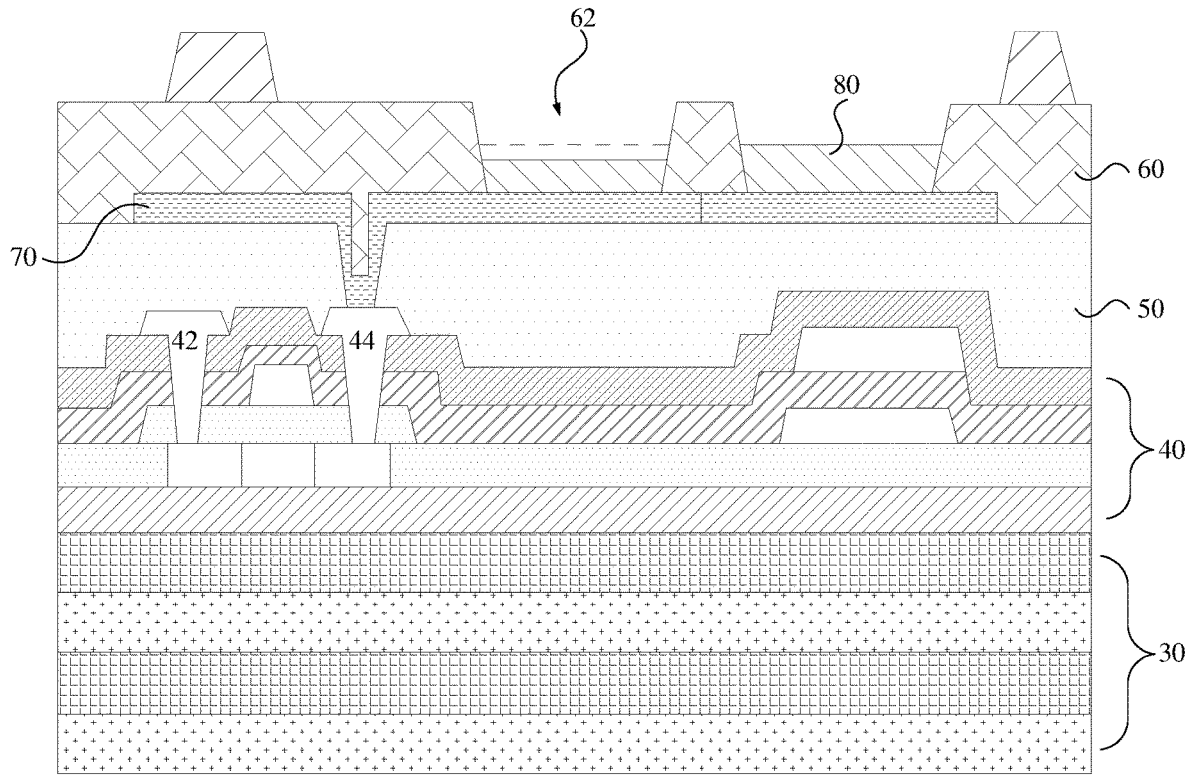
FIG. 5 is a cross-sectional view of a display panel according to another embodiment of the present disclosure.
Figure 6:
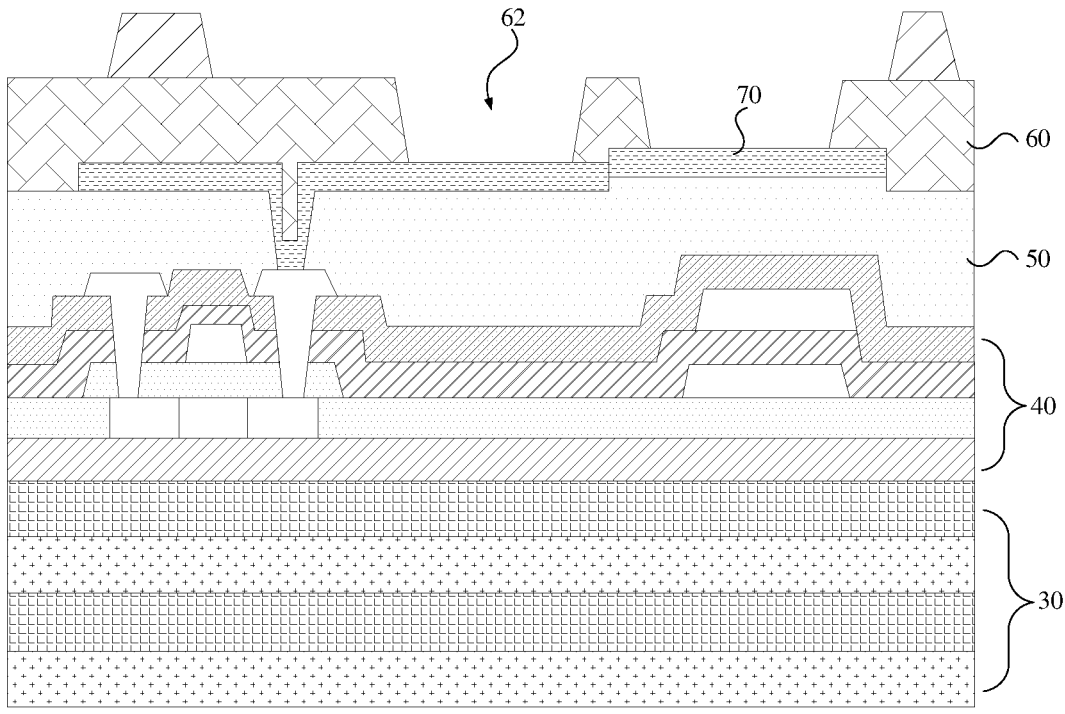
FIG. 6 is a cross-sectional view of a display panel according to still another embodiment of the present disclosure.

The embodiments of the present disclosure also provide a display panel 100, which can be an organic light emitting display panel. Referring to FIGS. 4 to 6, the sub-pixel at least includes a first electrode 70 and a second electrode (not shown), and a light-emitting layer 80 (see FIG. 5) located between the first electrode 70 and the second electrode. A pixel circuit applies a voltage between the first electrode 70 and the second electrode to excite carrier migration in the light-emitting layer 80 to emit light.

Specifically, the first electrode 70 can be an anode, and second electrode can be a cathode. The light-emitting layer 80 at least includes a hole transport layer, an organic material layer, and an electron transport layer. The first electrode 70 is configured to provide holes or transport holes to the hole transport layer, and the second electrode is configured to provide electrons or transport electrons to the organic material layer.

In some embodiments, the first electrode 70 may be made of transparent conductive oxide (TCO) materials such as indium tin oxide and indium zinc oxide, and the second electrode can be made of metal materials or TCO materials such as indium tin oxide and indium zinc oxide. The second electrode can be shared by a plurality of sub-pixels. Therefore, the second electrode can also be called a common electrode.

In some embodiments, the display panel 100 can further include a planarization layer 50 and a pixel definition layer 60 sequentially formed on a substrate.

Specifically, the substrate can include a base 30 and an array layer group 40 formed on the base 30. The array layer group 40 includes thin film transistors and conducting wires to control light emission of each sub-pixel, or control intensity of the emitted light of each sub-pixel. Thin film transistors are well known to those skilled in the art, and will not be specifically described herein.

Since the array layer group 40 has a complicated layer structure, its upper surface may be uneven. The planarization layer 50 is used to form a sufficiently even surface. After the planarization layer 50 is formed, through holes may be formed in the planarization layer 50 to expose source electrodes 42 and drain electrodes 44 of the array layer group 40. It should be understood that the planarization layer 50 can eliminate steps caused by the formation of the array layer group 40 and planarize an upper surface thereof, thereby reducing a risk of defects caused by the height difference of the elements below the light-emitting layer 80.

The pixel definition layer 60 defines a plurality of pixel apertures 62. The light-emitting layers 80 of the sub-pixels are arranged in the pixel apertures 62 to avoid color pollution or interference between adjacent sub-pixels. For example, in the embodiments shown in FIGS. 7 and 8, the first subordinate sub-pixels 12a and the second subordinate sub-pixels 12b have a shape of a triangle, and the second sub-pixels 14 and the third sub-pixels 16 both have a shape of a rectangle. Each of the second sub-pixel 14 and the third sub-pixel 16 includes an inner rectangle and an outer rectangle. The sides of the inner rectangles are called pixel sides, which are boundaries or edges of the pixel apertures 62 of the pixel definition layer (PDL layer) 60 shown in FIGS. 5 and 6. The sides of the outer rectangles are called virtual sides of the sub-pixels, and the virtual sides form outer boundaries or edges of the sub-pixels when a mask is arranged.

A distance between sub-pixels refers to a minimum distance between adjacent pixel sides of the sub-pixels. Since a distance between the first subordinate sub-pixel 12a and the second subordinate sub-pixel 12b is relatively small, they can share one mask aperture. Therefore, a first subordinate sub-pixel 12a and a second subordinate sub-pixel 12b share the same virtual sides. In this way, the difficulty in manufacturing the mask may be reduced and is thus more conducive to manufacturing the display panel 100 with a relatively large resolution.

In an embodiment, each pixel side and the corresponding virtual side of each sub-pixel are parallel to each other, and the vertical distance between the pixel side and the corresponding virtual side of each sub-pixel is the same in all sub-pixels. Consequently, the arrangement of the sub-pixels can be more uniform and ordered, thereby effectively improving the accuracy and yield in the manufacturing of the light-emitting layers of the sub-pixels, thus reducing a risk of wrinkles when stretching the mask.

In some other embodiments, the first subordinate sub-pixels 12a, the second subordinate sub-pixels 12b, the second sub-pixels 14, and the third sub-pixels 16 can have other shapes, for example, a quadrilateral, a hexagon, an octagon, a quadrilateral with rounded corners, a hexagon with rounded corners, or an octagon with rounded corners, and are not limited herein.

Figure 7:
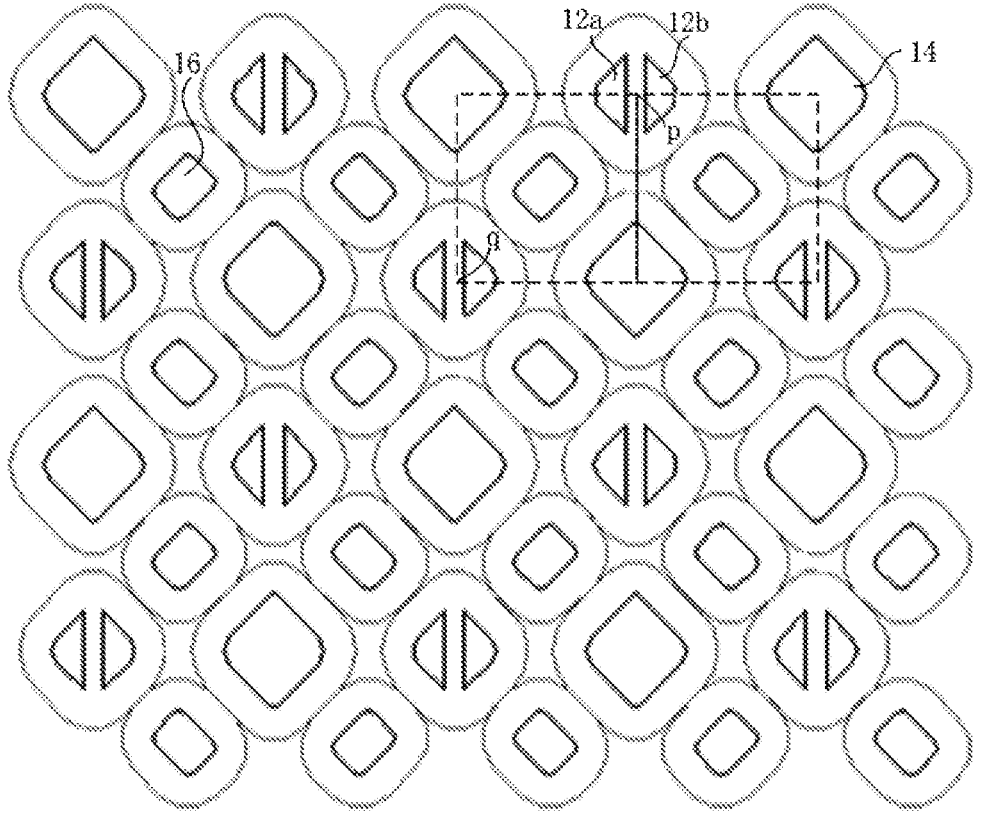
FIG. 7 is a schematic view of a pixel arrangement according to an embodiment of the present disclosure.
Figure 8:
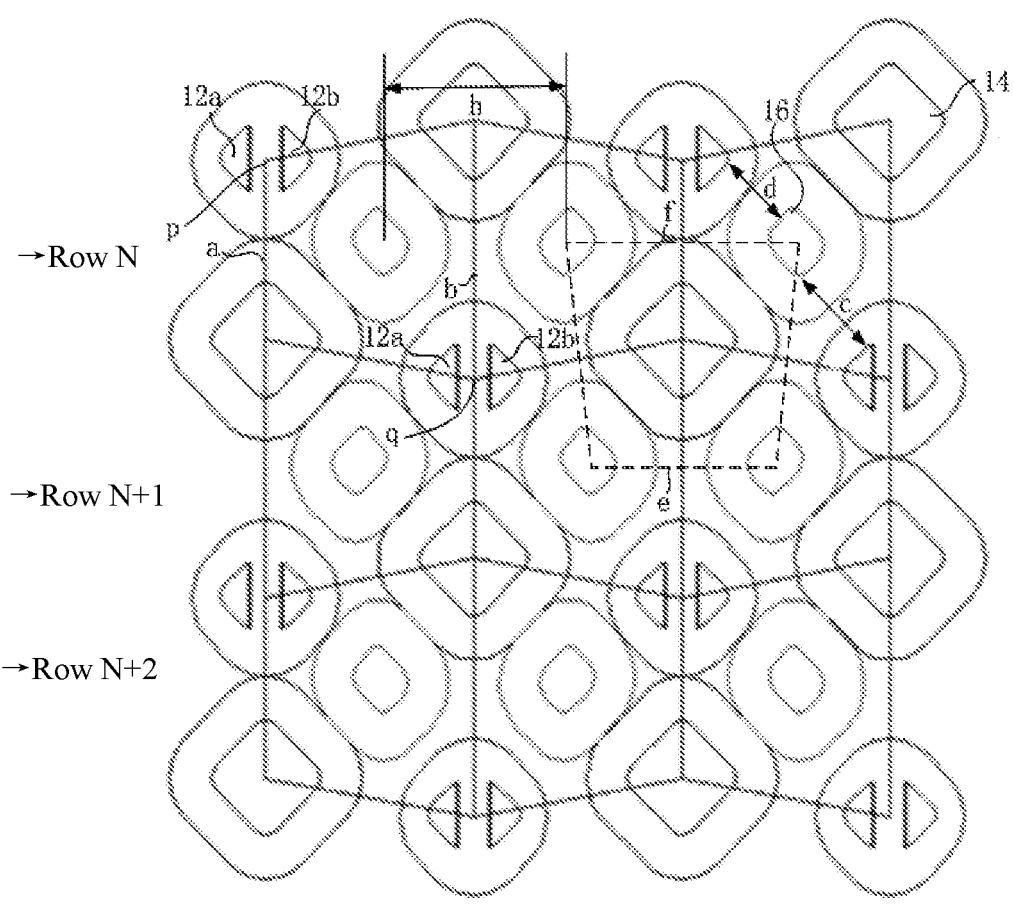
FIG. 8 is a schematic view of a pixel arrangement according to another embodiment of the present disclosure.

Referring still to FIGS. 7 and 8, the pixel arrangement structures include first sub-pixels and second sub-pixels 14, and each of the first sub-pixels include a first subordinate sub-pixel 12a and a second subordinate sub-pixel 12b. Two first sub-pixels and two second sub-pixels 14 form a first virtual quadrilateral, that is, two first sub-pixels and two second sub-pixels 14 are connected as a first virtual quadrilateral. FIG. 7 indicates two first virtual quadrilaterals (represented by dashed lines), and FIG. 8 indicates nine first virtual quadrilaterals (represented by solid lines).

In each first sub-pixel, the first subordinate sub-pixel 12a and the second subordinate sub-pixel 12b are opposite to each other and spaced apart from each other (for example, in a row direction). Each first vertex of the first virtual quadrilateral is located between the first subordinate sub-pixel 12*a* and the second subordinate sub-pixel 12*b*. In an embodiment, a midpoint of a line connecting the geometric centers of the first subordinate sub-pixel 12*a* and the second subordinate sub-pixel 12*b* is located at the first vertex of the first virtual quadrilateral. In this way, the arrangement of the sub-pixels is more ordered and uniform, which is beneficial to improve the display effect.

The second sub-pixels 14 are located at the second vertices of the first virtual quadrilateral. The first vertices and the second vertices are alternately arranged and spaced apart from each other. That is, the two first sub-pixels (also referred to as "two groups of subordinate sub-pixels") each consisting of one first subordinate sub-pixel 12*a* and one second subordinate sub-pixel 12*b* are respectively located at a pair of opposite corners of the first virtual quadrilateral, and the two second sub-pixels 14 are respectively located at another pair of opposite corners of the first virtual quadrilateral.

The pixel arrangement structure also includes a third sub-pixel 16. The third sub-pixel 16 is located within the first virtual quadrilateral, being surrounded by the two groups of subordinate sub-pixels 12 and the two second sub-pixels 14. Accordingly, on the one hand, the arrangement of the sub-pixels can be more compact, and the aperture ratio of each sub-pixel can be increased. On the other hand, the sub-pixels, a color of which the human eye is sensitive to, can be placed inside the first virtual quadrilateral to prevent color shift. For example, when red light, green light, and blue light are mixed to form white light, the white light can be composed by approximately 30% red light, 60% green light, and 10% blue light. Compared with other arrangements, when the third sub-pixel 16 is a green sub-pixel, the color mixing can be more uniform, and the color shift can be better alleviated. In another aspect, by setting two groups of subordinate sub-pixels, the decay rates of different subordinate sub-pixels can be adjusted to make the brightness of lights of the different colors better match up, thereby reducing the color shift at a large viewing angle.

A certain position at which a sub-pixel is located refers to a position range of the sub-pixel, as long as the sub-pixel overlaps the position. For example, in some embodiments, the center of the first sub-pixel or the second sub-pixel may not coincide with the vertex of the first virtual quadrilateral, that is, there is an offset between the vertex of the first virtual quadrilateral and the center of the first sub-pixel or the second sub-pixel. However, in order to ensure that the sub-pixels can be evenly distributed, the sub-pixel can have a center which coincides with a vertex of the first virtual quadrilateral, and that is, the second sub-pixel 14 may have a center which coincides with the second vertex of the first virtual quadrilateral. The center of the sub-pixel can be the geometric center of the shape of the sub-pixel or the center of the light-emitting color of the sub-pixel, which is not limited herein.

In some embodiments, the first virtual quadrilateral can have a shape of parallelogram or quasi-parallelogram.

Specifically, a midpoint of a line connecting centers of a group of subordinate sub-pixels (that is, a group of first subordinate sub-pixel 12*a* and second subordinate sub-pixel 12*b*) is a first midpoint p, and a midpoint of a line connecting centers of another group of subordinate sub-pixels (that is, another group of first subordinate sub-pixel 12*a* and second subordinate sub-pixel 12*b*) is a second midpoint q. In the first virtual quadrilateral, a distance between the center of the third sub-pixel 16 and the first midpoint p and a distance between the center of the third sub-pixel 16 and the second midpoint q can be equal to each other, and/or a distance between the center of the third sub-pixel 16 and a center of one of the two second sub-pixels 14 can be equal to a distance between the center of the third sub-pixel 16 and a center of the other one of the two second sub-pixels 14. The distance between the center of the third sub-pixel 16 and each of the first midpoint p and the second midpoint q is the first distance, and the distance between the center of the third sub-pixel 16 and the center of each of the two second sub-pixels 14 is the second distance. In the embodiment shown in FIG. 7, the first distance is equal to the second distance.

In an embodiment, the first virtual quadrilateral may be a rectangle or a rhombus. In this way, the pixel arrangement structures are relatively ordered, which is conducive to improving the display effect of the display panel 100. It should be noted that the quasi-parallelogram refers to the shape of the sub-pixel may not be strictly parallelogram, but roughly parallelogram, due to manufacturing limitations or for the convenience of manufacturing the mask. For example, a rounded rectangle or a corner-cutting rectangle with rounded corners. The rounded rectangle is a shape formed by rounding the corners of a rectangle, and a corner-cutting rectangle is a shape formed by cutting off one or more corners of a rectangle. The sub-pixels are provided with a shape of quasi-parallelogram or quasi-rectangle, which can adjust the aperture ratio of the sub-pixels more flexibly, and meet the requirements in manufacture of the mask.

The first virtual quadrilateral can have other shapes, and is not limited herein. For example, in some embodiments, in a row direction or a column direction, the first virtual quadrilateral has a first side a and a second side b, which are opposite to each other and have different lengths. The length of the first side a is smaller than the length of the second side b.

As shown in FIG. 8, the first virtual quadrilateral has four vertices, the first midpoint and the second midpoint respectively coincide with the two first vertices of the first virtual quadrilateral, and the centers of the two second sub-pixels 14 respectively coincide with the two second vertices of the first virtual quadrilateral. The first side a and the second side b are two sides each taking the first vertex and the second vertex as the endpoints. In the row direction, the first side a is a side with a smaller length, and the second side b is a side with a greater length.

As shown in FIG. 7, when the first virtual quadrilateral is a square, the arrangement of the sub-pixels may be uniform. However, due to different sizes of the light-emitting areas of different sub-pixels and due to the photolithography technique, it is difficult to further reduce the distance between the sub-pixels, which makes it difficult to effectively increase the pixel aperture ratio any further. In contrast, when the first side a and the second side b opposite to each other in the first virtual quadrilateral have different lengths, the positions of the first subordinate sub-pixel 12*a*, the second subordinate sub-pixel 12*b*, the second sub-pixel 14, and the third sub-pixel 16 can be adjusted to make the arrangement of the sub-pixels more compact. When allowed by the distance threshold in photolithography technique, the distance between adjacent sub-pixels can be reduced, thereby increasing the aperture ratio of the sub-pixels.

Optionally, the first side a and the second side b can be arranged parallel to each other. As shown in FIG. 8, in the row direction, every two adjacent first virtual quadrilaterals are arranged symmetrically about the first side a or the second side b as the axis of symmetry. In this way, the arrangement of the sub-pixels can be more ordered, the display effect can be improved, and the sub-pixels of the same color can be arranged in a row or a column, which reduces the conductive wiring difficulty and the difficulty of manufacturing the mask.

In some embodiments, the display panel 100 includes a plurality of the first virtual quadrilaterals, and the plurality of the first virtual quadrilaterals are arranged to form an array in a manner of sharing sides. For example, in the embodiment shown in FIG. 8, in the array, a plurality of first virtual quadrilaterals in the Nth row and a plurality of first virtual quadrilaterals in the (N+1)th row are engaged with each other, and the arrangement of the first virtual quadri-laterals in the Nth row is the same as the arrangement of the first virtual quadrilaterals in the (N+2)th row, where N≥1. Accordingly, during display, adjacent sub-pixels emitting light of different colors can form one light-emitting pixel. The pixels can borrow colors from each other thereby achieving a high-resolution display effect from low physical resolution.

In some embodiments of the present disclosure, the center of the third sub-pixel 16 deviates from the center of the first virtual quadrilateral. In the same first virtual quadrilateral, a distance between the third sub-pixel 16 and the first subor-dinate sub-pixel 12a of one of the two first sub-pixels is not equal to a distance between the third sub-pixel 16 and the second subordinate sub-pixel 12b of the other one of the two first sub-pixels, wherein the first subordinate sub-pixel 12a of one of the two first sub-pixels and the second subordinate sub-pixel 12b of the other one of the two first sub-pixels are closest to each other. In an embodiment, the distance between the center of the third sub-pixel 16 and the first midpoint p and the distance between the center of the third sub-pixel 16 and the second midpoint q are not equal to each other. It can be understood that the center of the first virtual quadrilateral can refer to a geometric center of the first virtual quadrilateral, that is, the intersection of two diagonal lines of the first virtual quadrilateral.

Specially, in the same first virtual quadrilateral, in the closest first subordinate sub-pixel 12a and second subordi-nate sub-pixel 12b respectively belonged to the two opposite first sub-pixels, a distance between the first subordinate sub-pixel 12a adjacent to the second side b and the third sub-pixel 16 is greater than a distance between the second subordinate sub-pixel 12b adjacent to the first side a and the third sub-pixel. When manufactured conditions are the same, in the aforementioned pixel arrangement structure, the distance between the third sub-pixels 16 respectively located in the two adjacent first virtual quadrilaterals sharing the second side b may be increased as compared with a tradi-tional pixel arrangement structure. Therefore, an available distance between the adjacent pixel apertures 62 is enlarged, which is conducive to the transport of the force of stretching the mask, and reduces the deformation of the mask, thereby reducing the difficulty of the manufacture process of the fine metal mask and the vapor deposition process.

Specifically, as shown in FIG. 8, the center of the third sub-pixel 16 deviates from the center of the first virtual quadrilateral. The distance between the third sub-pixel 16 and the first subordinate sub-pixel 12a is c, and the distance between the third sub-pixel 16 and the second subordinate sub-pixel 12b is d, where c>d. The distance h between the virtual sides of the third sub-pixels 16 in the two first virtual quadrilaterals sharing the second side b is increased, as compared to a traditional pixel arrangement structure, thereby ensuring the aperture ratio of the third sub-pixels 16, and reducing the difficulty in manufacturing the mask for the third sub-pixels 16.

The amount of input lights and the contrast of the light signals received by the photosensitive device under the display panel will affect the imaging quality of the photo-sensitive device. Therefore, although a lot of light-transmit-ting regions exist in a display panel with a traditional pixel arrangement structure to achieve substantially the same total light-transmitting area, an area of a continuous light-trans-mitting region in a specific location is small, which cannot meet the light transmittance criteria for normal operation of the photosensitive device under the display panel. In the exemplary embodiments of the present disclosure, in the first virtual quadrilateral, the distances respectively between the third sub-pixel 16 and the closest first and second subordinate sub-pixels 12a, 12b located at opposite corners are not equal to each other, and thus an area of a continuous light-transmitting region may be increased, thereby increas-ing the light transmittance of the display panel 100, which is conducive to the functional diversification of the display panel 100. For example, in the embodiment shown in FIG. 8, the virtual sides of the two third sub-pixels 16 in two adjacent first virtual quadrilaterals sharing the second side b, the virtual sides of the second sub-pixel 14 shared by the two first virtual quadrilaterals, and the virtual sides of the first subordinate sub-pixel 12 and the second subordinate sub-pixel 14 sharing the same mask aperture cooperatively form a light-transmitting region. The light-transmitting regions formed by the virtual sides of the sub-pixels in a plurality of adjacent first virtual quadrilaterals can be connected to form a large light-transmitting region, thereby effectively increas-ing the light transmittance of the display panel 100.

In some embodiments, in the same first virtual quadrilat-eral, the distance between the first subordinate sub-pixel 12a or the second subordinate sub-pixel 12b in one first sub-pixel and any adjacent second sub-pixel 14 is not equal to the distance between the second subordinate sub-pixel 12b or the first subordinate sub-pixel 12a in the other first sub-pixel and any adjacent second sub-pixel 14. In this way, the arrangement of the sub-pixels can be more compact, and there is sufficient space to adjust the position of the third sub-pixel 16 to differentiate the distance between the first subordinate sub-pixel 12a and the third sub-pixel 16 from the distance between the second subordinate sub-pixel 12b and the third sub-pixel 16. Therefore, the distance between the third sub-pixels 16 in the two first virtual quadrilaterals sharing the second side b is increased, which is conducive to reducing the manufacturing difficulty of the mask. For example, in some embodiments, the distances between the first subordinate sub-pixel 12a of one first sub-pixel and two adjacent second sub-pixels 14 are both smaller than the distances between the first subordinate sub-pixels 12b in the opposite first sub-pixels and the two adjacent second sub-pixels 14.

As shown in FIG. 8, in the same first virtual quadrilateral, the virtual side of the first sub-pixel can abut against the virtual side of one of the adjacent second sub-pixels and spaced apart from the virtual side of the other one of the adjacent second sub-pixels for a preset distance, so as to increase the distance between the first sub-pixel and the other adjacent second sub-pixel, which is conductive to increase the aperture ratio of the sub-pixel. In addition, since the first subordinate sub-pixel 12b of the other first sub-pixel is far away from the two adjacent second sub-pixels 14, the positions of the third sub-pixel 16 can be adjusted to increase the distance between the two third sub-pixels 16 on both sides of the second side b while ensuring the pixel aperture ratio, thereby reducing the difficulty of manufacturing the mask. In some other embodiments, in the same first virtual quadrilateral, the distances, respectively, between the first subordinate sub-pixel 12a and the two second sub-pixels 14 which are adjacent to the first subordinate sub-pixel 12a can be equal or not equal to each other, or distances, respectively, between the second subordinate sub-pixel 12b and the two second sub-pixels 14 which are adjacent to the second subordinate sub-pixel 12b can be equal or not equal to each other, the first subordinate sub-pixel 12a and the second subordinate sub-pixel 12b belong to one first sub-pixel; the distances, respectively, between the second subordinate sub-pixel 12b and the two second sub-pixels 14 which are adjacent to the second subordinate sub-pixel 12b can be equal or not equal to each other, or the distances, respectively, between the first subordinate sub-pixel 12a and the two second sub-pixels 14 which are adjacent to the first subordinate sub-pixel 12a can be equal or not equal to each other, the second subordinate sub-pixel 12b and the first subordinate sub-pixel 12a belong to the other first sub-pixel. That is, in the same first virtual quadrilateral, distances between the first subordinate sub-pixel 12a or the second subordinate sub-pixel 12b corresponding to any one of the two opposite first sub-pixels and the adjacent second sub-pixels 14 can be not equal to each other. Similarly, the distances can be set reasonably according to different needs, so as to reduce the difficulty of manufacturing the mask while ensuring the pixel aperture ratio.

In some embodiments, in the same first virtual quadrilateral, a distance between the center of the third sub-pixel 16 and the first midpoint p and/or the second midpoint q is not equal to a distance between the center of the third sub-pixel 16 and the center of any second sub-pixel 14. Increasing the light-emitting area of the sub-pixel with a large decay rate may reduce the color shift. However, if just increasing the light-emitting area of the sub-pixel and not changing the pixel arrangement, the distance between the sub-pixels will decrease, and the aperture ratio of the sub-pixels will be reduced. In this embodiment, the distance between the center of the third sub-pixel 16 and the first midpoint p and/or the second midpoint q is not equal to the distance between the center of the third sub-pixel 16 and the center of any second sub-pixel 14. In this way, the first subordinate sub-pixels 12a, the second subordinate sub-pixels 12b, the second sub-pixels 14, and the third sub-pixels 16 can be closely arranged, so that the light-emitting area of the sub-pixels can be increased under the condition of the same resolution. For example, the distance between the center of the third sub-pixel 16 and any of the first midpoint p and the second midpoint q is smaller than the distance between the center of the third sub-pixel 16 and the center of any second sub-pixel 14, so that the first subordinate sub-pixels 12a, the second subordinate sub-pixels 12b, the second sub-pixels 14, and the third sub-pixels 16 may be closely arranged, and thus the light-emitting area of the second sub-pixels 14 may be increased under the condition of the same resolution. Optionally, the distances between the center of the third sub-pixel 16 and the centers of the two second sub-pixels 14 can be equal or not equal to each other, which is not limited herein.

In some embodiments, in the two opposite inner angles of the same first virtual quadrilateral, one inner angle is less than 90°, and the other inner angle is greater than 90°. Referring to FIG. 8, in the first virtual quadrilateral, the first side a is parallel to the second side b. In the two inner angles of the first virtual quadrilateral corresponding to the positions of the two groups of subordinate sub-pixels, one inner angle is less than 90°, and the other inner angle is greater than 90°. In the two inner angles of the first virtual quadrilateral corresponding to the positions of the two second sub-pixels 14, one inner angle is smaller than 90°, and the other inner angle is greater than 90°. In this way, under the same manufacturing conditions, the arrangement of the first subordinate sub-pixels 12a, the second subordinate sub-pixels 12b, the second sub-pixels 14, and the third sub-pixels 16 is more compact as compared with other arrangements (for example, the two opposite inner angles are both less than 90° or both greater than 90°), thereby effectively increasing the aperture ratio of the sub-pixels.

In other embodiments, in the first virtual quadrilateral, the first side a and the second side b can be non-parallel, and a pair of inner angles can be 90°; one inner angle of the other pair of inner angles can be less than 90°, and the other inner angle of the other pair of inner angles may be greater than 90°, which is not limited herein.

In the first virtual quadrilateral, if the length difference between the first side a and the second side b is too large, the difference between the opposite inner angles of the first virtual quadrilateral will be too large, which will cause the arrangement of the sub-pixels to be too loose and affect the aperture ratio of the sub-pixels.

In an embodiment, the ratio of the length of the first side a to the length of the second side b of the first virtual quadrilateral can range from 0.5 to 0.95. In the embodiment shown in FIG. 8, the length a of the first side a is less than the length b of the second side b, and a:b ranges from 0.5 to 0.95. In this way, the sub-pixel arrangement can be made more compact on the premise of meeting the technique limits.

The minimum distance between sub-pixels should meet the technical limit distance. The technical limit distance is related to the manufacturing process used. For example, when the FMM is used in the etching process to form the sub-pixel pattern, the minimum distance may be about 16 μm; when laser or electroforming technique is used in forming the sub-pixel pattern, the minimum distance can be even smaller.

In each exemplary embodiment of the present disclosure, in the row direction or the column direction, any two first virtual quadrilaterals sharing a first side a or a second side b form a group; the two first virtual quadrilaterals sharing a second side b or a first side a in an adjacent row or column form another group. The four first virtual quadrilaterals in the two groups share a first vertex or a second vertex, and the lines connecting the centers of the four third sub-pixels 16 in the first virtual quadrilaterals of the two groups form a second virtual quadrilateral. For example, in the embodiments shown in FIG. 8, in the same first virtual quadrilateral, the first side a is parallel to the second side b. In the row direction, the two first virtual quadrilaterals share the first side a. In an adjacent row, the two first virtual quadrilaterals share the second side b. Lines connecting the centers of the four third sub-pixels 16 in the four first virtual quadrilaterals form a second virtual quadrilateral. In the column direction, the second virtual quadrilateral has a third side e and a fourth side f opposite to each other and unequal in length. With such a design, the arrangement of the first sub-pixels 12, the second sub-pixels 14, and the third sub-pixels 16 can be additionally compacted, which is conducive to increase the aperture area of the sub-pixels and increase the pixel aperture ratio.

Optionally, the third side e and the fourth side f in the second virtual quadrangle are parallel to each other. Consequently, the lines connecting the centers of the third sub-pixels 16 in the same row or column can be located on the same straight line, thereby further reducing the difficulty in arranging conductive wires and the difficulty in manufacturing a mask. Referring to FIG. 7 or 8, in the first virtual quadrilateral, the first side a is parallel to the second side b, and in the second virtual quadrilateral, the third side e is parallel to the fourth side f, and the extension directions of the third side e and the fourth side f are perpendicular to the extension directions of the first side a and the second side b. In this way, the arrangement of the sub-pixels is uniform and more ordered, which is conducive to improving the display uniformity, which reduces the difficulty of making the mask.

In embodiments of the present disclosure, the third sub-pixel 16 has a shape of rectangle or quasi-rectangle. The length direction of the plurality of third sub-pixels 16 is oblique with respect to the row direction or the column direction. It should be understood that the force applied to the mask is usually transferred in the row direction or the column direction; for example, the force of stretching the mask can be transferred in the row direction. The aperture of the mask corresponding to the third sub-pixel 16, which is oblique with respect to the row direction or the column direction, can decompose the force in the row direction and the column direction, thereby avoiding the deformation of the aperture caused by the concentration of the force of stretching the mask applied to the FMM, and reducing the difficulty in the manufacturing process, and the stretching difficulty of the mask. In addition, when the apertures of the mask are arranged obliquely, the mask in the same length and same width can include more apertures, thereby reducing the manufacturing cost of the mask. In one embodiment, the angle formed between the length direction of the third sub-pixels 16 and the row direction or the column direction is 45° to 135°.

Optionally, in the row direction or the column direction, the minimum distance between a virtual side of any third sub-pixel 16 and the closest virtual side of another third sub-pixel 16 adjacent to the third sub-pixel 16 is a third of the distance y. In the column direction or the row direction, the minimum distance between a virtual side of the third sub-pixel 16 and the closest virtual side of still another third sub-pixel adjacent thereto is a fourth of the distance x, where y<x. That is to say, since the distance between the first subordinate sub-pixel 12a adjacent to the second side b and the third sub-pixel 16 is greater than the distance between the second subordinate sub-pixel 12b adjacent to the first side a and the third sub-pixel 16, the distance between any third sub-pixel 16 and another third sub-pixel 16 adjacent thereto in the row direction is not equal to the distance between the third sub-pixel 16 and still another third sub-pixel 16 adjacent thereto in the column direction.

In addition, in order to take into account the compactness of the arrangement of the sub-pixels and obliquely arrange the length direction of the third sub-pixel 16 in the same direction with respect to the row direction or the column direction, the first distance y may be smaller than the second distance x.

The quasi-rectangular refers to that due to manufacturing limitations or for the convenience of making the mask, the shape of the sub-pixel may not be strictly parallelogram or rectangle, but be roughly parallelogram or roughly rectangle, for example, a rounded rectangle or a corner-cutting rectangle with rounded corners. A rounded rectangle is a shape formed by rounding the corners of a rectangle, and a corner-cutting rectangle is a shape formed by cutting off one or more corners of a rectangle. The sub-pixels are provided with a shape of quasi-parallelogram or quasi-rectangular, which can adjust the aperture ratio of the sub-pixels more flexibly, and meet the requirements in the manufacturing of the mask.

In some embodiments of the present disclosure, the first subordinate sub-pixel 12a and the second subordinate sub-pixel 12b can be made to have different decay rates of brightness. Since the two subordinate sub-pixels emit lights in the same color and have different decay rates of brightness, the brightness of light of the corresponding color can be adjusted, such that the brightness of lights of different colors are better paired, thereby reducing the color shift at a large viewing angle. In some embodiments, the color of the light emitted by the first subordinate sub-pixel 12a and the second subordinate sub-pixel 12b is red. Since the organic light-emitting material that emits a blue light is more likely to decay, the light emitted from the pixel unit is more likely to be reddish in order to cause the color shift. When the display panel 100 appears to be reddish as the viewing angle increases, the corresponding first subordinate sub-pixel 12a and second subordinate sub-pixel 12b can be controlled to match the decay rates of the brightness of the red light and the blue light, thereby reducing the color shift phenomenon at the large viewing angle.

Specifically, the lights emitted by the two subordinate sub-pixels can have different FWHM values, so that the two subordinate sub-pixels have different decay speeds. As an embodiment, the first subordinate sub-pixel 12a and the second subordinate sub-pixel 12b are electrically connected to different pixel circuits. In this way, the FWHM values of the lights emitted by the two subordinate sub-pixels can be changed by changing the electric currents of the two subordinate sub-pixels, to make the two subordinate sub-pixels have different decay speeds, thereby differentiating the decay rates of brightness. In an embodiment, as shown in FIG. 8, in the same first virtual quadrilateral, the first subordinate sub-pixel 12a and the second subordinate sub-pixel 12b that belong to two opposite first sub-pixels and are closest to each other and are electrically connected to a same pixel circuit, the other first subordinate sub-pixel 12a and the other second subordinate sub-pixel 12b can be electrically connected to another pixel circuit. In this way, on the one hand, the pixel circuits are simplified, and on the other hand, the subordinate sub-pixels with different FWHM values of the emitted lights are arranged more orderly, which is conducive to improving the uniformity of the display.

However, in some high-resolution display panels 100, reducing the wiring difficulty of the pixel circuits is conducive to improving the production yield of the display panels 100 and to reducing the production costs of the display panels 100. As an embodiment, the first subordinate sub-pixel 12a and the second subordinate sub-pixel 12b of the same first sub-pixel can be electrically connected to the same pixel circuit, and the decay rate of each subordinate sub-pixel can be adjusted by changing the microcavity effect of the subordinate sub-pixel or the characteristics of the organic light-emitting material, thereby reducing the color shift phenomenon at the large viewing angle. In this way, the two subordinate sub-pixels in the same sub-pixel are electrically connected to one pixel circuit, which can simplify the complexity of the pixel circuit.

In an embodiment, at least one of the first electrodes 70, the light-emitting layers 80, and the second electrodes, in different subordinate sub-pixels of the same first sub-pixel, have different thicknesses. The first electrode 70, the light-emitting layer 80, and the second electrode of a sub-pixel constitute an optical micro-resonant cavity, that is, a microcavity. As shown in FIG. 4, since the thickness of the first electrode 70 affects the magnitude of the microcavity effect, by changing the thicknesses of the first electrodes 70 of the two subordinate sub-pixels, the FWHM values of the lights emitted by the two subordinate sub-pixels can be different, thereby adjusting the wavelength ranges of the lights emitted by the subordinate sub-pixels. In this way, the decay rates of brightness of the first subordinate sub-pixel 12a and the second subordinate sub-pixel 12b can be better matched with the decay rates of the brightness of the lights emitted by other sub-pixels, thereby effectively reducing the color shift with the viewing angle. Correspondingly, the lights emitted by the two subordinate sub-pixels can also have different FWHM values by changing the thicknesses of the second electrode. For example, increasing the thickness of a second electrode can reduce the FWHM of the light emitted by the corresponding subordinate sub-pixel, and reducing the thickness of a second electrode can increase the FWHM of the light emitted by the corresponding subordinate sub-pixel.

In other embodiments, as shown in FIG. 5, the thickness of the light-emitting layer 80 can be adjusted to adjust the thickness of the microcavity, so as to adjust the wavelength range of the light emitted by the first subordinate sub-pixel 12a of the first sub-pixel, in order to better match the decay rate of brightness of the first subordinate sub-pixel 12a of the first sub-pixel with the decay rates of the lights emitted by other sub-pixels. In some embodiments, the light-emitting layer 80 at least includes a hole transport layer, an organic material layer, and an electron transport layer. At least one of the hole transport layers, the organic material layers, and the electron transport layers, in different subordinate sub-pixels of the same first sub-pixel, have different thicknesses. In this way, the thickness of the microcavity can be adjusted by making the thicknesses of the light-emitting layers 80 of the two subordinate sub-pixels. In other embodiments, the light-emitting layer 80 can also include other film layers such as a hole injection layer and an electron injection layer. The thickness of the aforementioned film layers can also be changed to make the thicknesses of the light-emitting layers 80 of different subordinate sub-pixels of the same first sub-pixel different.

In still some other embodiments, a distance between a part of an upper surface of the planarization layer 50 located in the position corresponding to the first subordinate sub-pixel 12a and the substrate is different from a distance between another part of the upper surface of the planarization layer 50 located in the position corresponding to the second subordinate sub-pixel 12b and the substrate. Specifically, as shown in FIG. 6, the first electrode 70 of the sub-pixel is formed on the planarization layer 50, and the distances from the surfaces, facing away from the substrate, of the planarization layer 50 located in the positions corresponding to the two subordinate sub-pixels 12a, 12b to the substrate are different. In this way, the first electrodes 70 of the two subordinate sub-pixels formed on the substrate are located at different heights from the substrate. In this way, the magnitude of the microcavity effect is changed, so that the lights emitted by the two subordinate sub-pixels have different FWHM values, and the two subordinate sub-pixels have different decay rates, and thus the two subordinate sub-pixels have different brightness values after a period of use. In particular, compared with changing the thicknesses of the first electrodes 70, by changing the thickness of the planarization layer 50 in the positions corresponding to different subordinate sub-pixels, the manufacture is easier to control.

Figure 3:
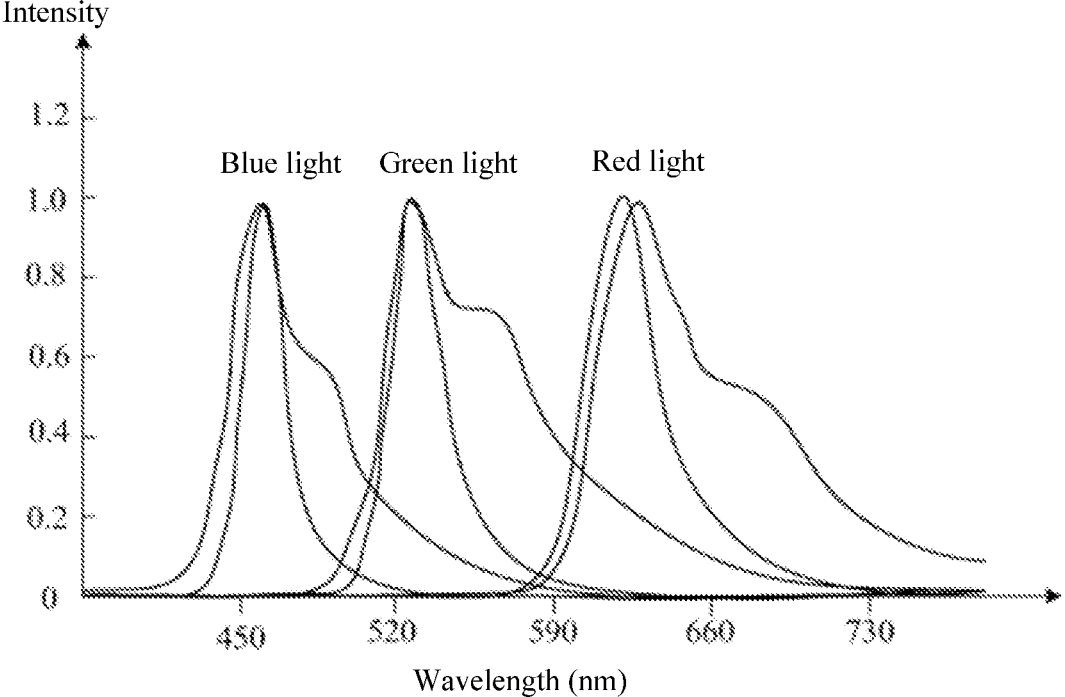
FIG. 3 is a graph showing spectra of red light, green light and blue light according to an embodiment.
Figure 9:
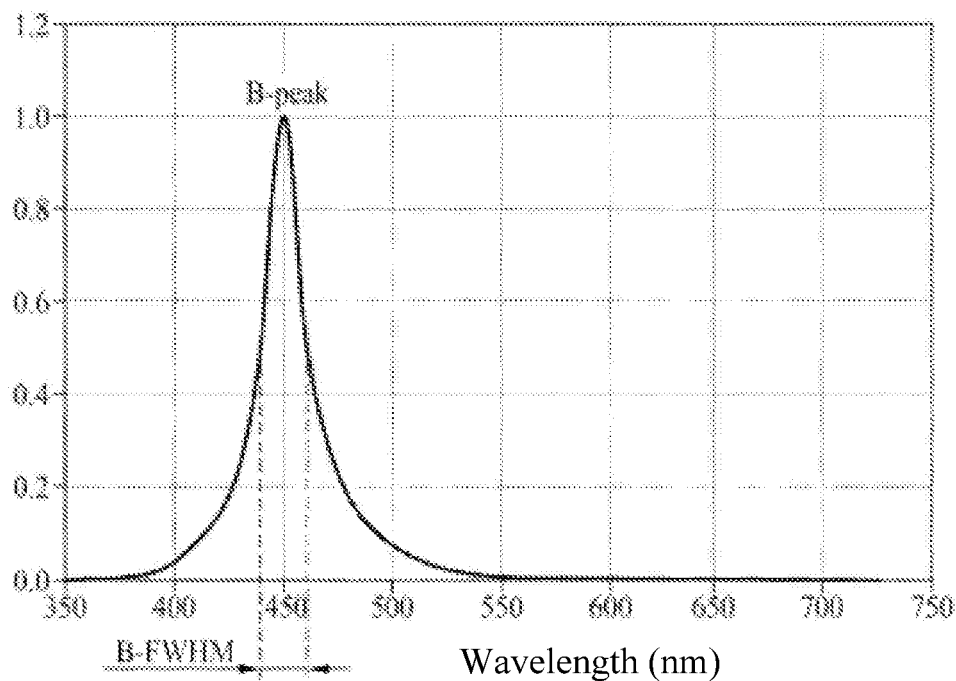
FIG. 9 is a spectrum graph of a second type of organic light-emitting material according to an embodiment of the present disclosure.

In exemplary embodiments of the present disclosure, the two subordinate sub-pixels of the first sub-pixel can be made of different types of organic light-emitting materials, so that the FWHM values of the lights emitted by the two subordinate sub-pixels are different. It should be understood that, due to the different kinds or purity of the materials, the organic light-emitting materials may emit lights of the same color having different spectral curves. Generally, the narrower the FWHM of the spectrum, the higher the light purity and brightness, but the faster the decay. For example, as shown in FIG. 3, taking blue light as an example, the organic light-emitting material emitting the blue light is a first type of organic light-emitting material, and the blue light emitted by the organic light-emitting material has a lower light purity as the spectrum curve thereof has a wider FWHM and includes a secondary peak. As shown in FIG. 9, the organic light-emitting material emitting the blue light is a second type of organic light-emitting material, and the blue light emitted by the organic light-emitting material has a higher light purity as the spectrum curve thereof has a narrower FWHM and includes no secondary peak, that is, the emitted light contains no background peaks. It can be seen that although both emitting the same color, the second type of organic light-emitting material has higher luminous efficiency and is more energy saving than the first type of organic light-emitting material. However, due to the narrow intrinsic spectrum, brightness of the second type of organic light-emitting material attenuates faster. Therefore, the decay rate of brightness of the light emitted by the first type of organic light-emitting material is different from the decay speed of brightness of the light emitted by the second type of organic light-emitting material that emits light of the same color. The material characteristic of the organic light-emitting materials of the two subordinate sub-pixels can be changed to realize the adjustment of the decay rate of brightness of the light emitted by each subordinate sub-pixel, thereby reducing the color shift at a large viewing angle, and taking into account the power consumption and the color shift to achieve a balance.

Based on the same inventive concept, the present disclosure also provides a mask, configured to manufacture the display panel 100 provided by the embodiments of the present disclosure. The mask includes a plurality of aperture regions corresponding to the shapes and positions of the first subordinate sub-pixels 12a, the second subordinate sub-pixels 12b, the second sub-pixels 14, or the third sub-pixels 16. The aperture regions are configured to form the first subordinate sub-pixels 12a, the second subordinate sub-pixels 12b, the second sub-pixels 14, or the third sub-pixels 16 described in the aforementioned embodiments.

Based on the same inventive concept, the present disclosure also provides a display device, which includes the display panel 100 provided in any embodiment of the present disclosure.

Specifically, the display device can be applied to fields such as mobile phone terminals, bionic electronics, electronic skins, wearable devices, in-vehicle devices, Internet of Things devices, and artificial intelligence devices. For example, the aforementioned display device may be a digital device such as a mobile phone, a tablet, a palmtop computer, an iPod, and a smart watch.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A display panel, comprising:

at least two first sub-pixels, at least two second sub-pixels, and a third sub-pixel, wherein the at least two first sub-pixels and the at least two second sub-pixels are connected as a first virtual quadrilateral;

wherein the at least two second sub-pixels are respectively located at two second vertices of the first virtual quadrilateral;

wherein each of the at least two first sub-pixels comprises a first subordinate sub-pixel and a second subordinate sub-pixel facing to each other and spaced apart from each other;

wherein one of two first vertices of the first virtual quadrilateral is located between the first subordinate sub-pixel and the second subordinate sub-pixel of one of the at least two first sub-pixels;

wherein the other one of the two first vertices of the first virtual quadrilateral being is located between the first subordinate sub-pixel and the second subordinate sub-pixel of another one of the at least two first sub-pixels;

wherein the two first vertices and the two second vertices being are alternately arranged and spaced apart from each other; and wherein the third sub-pixel is located within the first virtual quadrilateral;

wherein a full width at half maximum (FWHM) of light emitted from the first subordinate sub-pixel is different from that of light emitted from the second subordinate sub-pixel;

wherein a center of the third sub-pixel deviates from a center of the first virtual quadrilateral; and wherein in a row direction or a column direction, the first virtual quadrilateral has a first side and a second side opposite to each other, a length of the first side is less than a length of the second side, and the first side is parallel to the second side;

wherein in a same first virtual quadrilateral, the first subordinate sub-pixel and the second subordinate sub-pixel respectively belong to two first sub-pixels, and are the closest pair of first and second subordinate sub-pixels respectively belonging to two first sub-pixels in a same first virtual quadrilateral, a minimum distance between the first subordinate sub-pixel adjacent to the second side and the third sub-pixel being greater than a minimum distance between the second subordinate sub-pixel adjacent to the first side and the third sub-pixel.

2. The display panel according to claim 1, wherein the first subordinate sub-pixel and the second subordinate sub-pixel of a same first sub-pixel are respectively electrically connected to different pixel circuits.

3. The display panel according to claim 1, wherein the first subordinate sub-pixel and the second subordinate sub-pixel, which are respectively belonged to two first sub-pixels and closest to each other, are electrically connected to a same pixel circuit.

4. The display panel according to claim 1, wherein the first subordinate sub-pixel and the second subordinate sub-pixel of a same first sub-pixel are electrically connected to a same pixel circuit.

5. The display panel according to claim 4, wherein each of the first subordinate sub-pixel and the second subordinate sub-pixel comprises:

a first electrode;

a light-emitting layer; and a second electrode which are sequentially stacked; and wherein at least one of the first electrodes, the light-emitting layers, and the second electrodes, in the first subordinate sub-pixel and the second subordinate sub-pixel of a same first sub-pixel, have different thicknesses.

6. The display panel according to claim 5, wherein the light-emitting layer comprises:

a hole transport layer;

an organic material layer; and an electron transport layer; and wherein at least one of the hole transport layers, the organic material layers, and the electron transport layers, in the first subordinate sub-pixel and the second subordinate sub-pixel of a same first sub-pixel, have different thicknesses.

7. The display panel according to claim 4, wherein the display panel comprises:

a planarization layer formed on a substrate; and wherein the first sub-pixels, the second sub-pixels, and the third sub-pixel are all disposed on the planarization layer; and wherein a distance between a part of an upper surface of the planarization layer corresponding to the first subordinate sub-pixel and the substrate is different from a distance between another part of the upper surface of the planarization layer corresponding to the second subordinate sub-pixel and the substrate.

8. The display panel according to claim 1, further comprising a plurality of first virtual quadrilaterals, and the plurality of first virtual quadrilaterals are arranged to form an array in a manner of sharing sides.

9. The display panel according to claim 1, wherein a midpoint of a line connecting centers of the first subordinate sub-pixel and the second subordinate sub-pixel of a same first sub-pixel is located at one of the first vertices of the first virtual quadrilateral.

10. The display panel according to claim 1, wherein a midpoint of a line connecting centers of the first subordinate sub-pixel and the second subordinate sub-pixel of a same first sub-pixel coincides with one of the first vertices.

11. The display panel according to claim 1, wherein one of two opposite inner angles of the first virtual quadrilateral is less than 90°, and the other one of the two opposite inner angles is greater than 90°.

12. The display panel according to claim 11, wherein a midpoint of a line connecting centers of the first subordinate sub-pixel and the second subordinate sub-pixel in one of the at least two first sub-pixels is a first midpoint;

wherein a midpoint of a line connecting centers of the first subordinate sub-pixel and the second subordinate sub-pixel in another one of the at least two first sub-pixels is a second midpoint; and wherein in a same first virtual quadrilateral, a distance between a center of the third sub-pixel and any one of the first midpoint and the second midpoint is not equal to a distance between the center of the third sub-pixel and any one of centers of the at least two second sub-pixels.

13. The display panel according to claim 1, comprising a plurality of first virtual quadrilaterals arranged to form an array in a manner of sharing sides.

14. The display panel according to claim 12, wherein in the row direction or the column direction, any two first virtual quadrilaterals sharing the first side or the second side forms a group;

wherein two first virtual quadrilaterals sharing another second side or another first side in an adjacent row or an adjacent column forms another group;

wherein for two groups of first virtual quadrilaterals, four first virtual quadrilaterals share one of the first vertices or one of the second vertices, and lines connecting the centers of four third sub-pixels form a second virtual quadrilateral;

wherein in the column direction or the row direction, the second virtual quadrilateral comprises a third side and a fourth side opposite to each other and unequal in length; and wherein the third side and the fourth side are parallel to each other.

15. A display device, comprising the display panel according to claim 1.

16. The display panel according to claim 1, wherein a decay rate of brightness of light emitted from the first subordinate sub-pixel is different from that of brightness of light emitted from the second subordinate sub-pixel.

\*  \*  \*  \*  \*